United States Patent
Bauer et al.

(10) Patent No.: US 6,863,398 B2
(45) Date of Patent: Mar. 8, 2005

(54) METHOD AND COATING SYSTEM FOR COATING SUBSTRATES FOR OPTICAL COMPONENTS

(75) Inventors: Harry Bauer, Aalen (DE); Matthias Heller, Hohenahr (DE); Hans-Jochen Paul, Aalen (DE); Jens Ullmann, Oberkochen (DE); Patrick Scheible, Aalen (DE); Christoph Zaczek, Heubach (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/244,419

(22) Filed: Sep. 17, 2002

(65) Prior Publication Data

US 2003/0082298 A1 May 1, 2003

(30) Foreign Application Priority Data

Sep. 17, 2001 (DE) ......................................... 101 46 192
Aug. 12, 2002 (DE) ......................................... 102 37 430

(51) Int. Cl.[7] ............................. G02C 7/02; B05D 5/06
(52) U.S. Cl. ........................ 351/177; 351/166; 427/162; 427/165
(58) Field of Search .................................. 351/177, 159, 351/166, 884; 427/162, 163.1, 165, 168, 421, 424–425, 427, 282; 118/720–721, 730

(56) References Cited

U.S. PATENT DOCUMENTS

| | | | |
|---|---|---|---|
| 4,416,217 A | 11/1983 | Nakamura et al. | 118/726 |
| 5,518,548 A | 5/1996 | Ramberg et al. | 118/726 |
| 6,142,097 A | 11/2000 | Tomofuji | 118/723 VE |
| 6,352,747 B1 * | 3/2002 | Blackburn et al. | 427/425 |
| 2001/0053407 A1 * | 12/2001 | Becker et al. | 427/8 |
| 2002/0080503 A1 * | 6/2002 | Hatakeyama et al. | 359/850 |

FOREIGN PATENT DOCUMENTS

WO   WO 99/46421 A1   9/1999

OTHER PUBLICATIONS

Harry Bauer, et al., "Optical Coatings for UV Photolithography Systems", SPIE, vol. 2776 (Aug. 1996), pp. 353–365.

* cited by examiner

Primary Examiner—Jordan M. Schwartz
(74) Attorney, Agent, or Firm—Sughrue Mion, PLLC (57) ABSTRACT

A method for coating substrates (10) for optical components with essentially rotationally symmetric coatings employs a coating system equipped with a planetary-drive system (1) that has a rotating planet carrier (2) and several planets (4), each of which carries a single substrate, that corotate both with the planet carrier and with respect to the primary carrier. In one embodiment a set of stationary first masks (20) that allow controlling the radial variation in physical film thickness is arranged between a source (8) of material situated beneath the planets and the substrates. A set of second masks that mask off evaporation angles exceeding a limiting evaporation or incidence angle ($\beta$ max) for every substrate also corotate with the primary carrier (2), which allows depositing coatings having a prescribed radial film-thickness distribution and a virtually constant density of the coating material over their full radial extents for relatively low, and only slightly varying, evaporation angles.

40 Claims, 6 Drawing Sheets

METHOD AND COATING SYSTEM FOR COATING SUBSTRATES FOR OPTICAL COMPONENTS

The following disclosure is based on German Patent Applications No. 101 46 192.5 filed on Sep. 17, 2001 and No. 102 37 430.9 filed on Aug. 12, 2002, which are incorporated into this application by reference.

BACKGROUND OF THE INVENTION

1. Field of the Invention

The invention relates to a method for coating substrates for optical components with essentially rotationally symmetric optical coatings and a coating system suitable for carrying out that method.

2. Description of the Related Art

Optical systems that have a plurality of lenses that must be coated with rotationally symmetric optical coatings in order to reduce their reflectance or allow meeting other requirements are employed on projection systems for the microlithographic fabrication of semiconductor devices and other types of microdevices. If necessary, other optical components, such as the imaging mirrors employed on catadioptric or catoptric projection lenses, some of which may have sharply curved surfaces, will also have to be coated. These optical coatings should normally have an accurately controlled, usually as uniform as possible, optical effect over the entire optically utilized portion of the coated surfaces involved.

The effects of coated surfaces in optical trains are largely dependent upon the film-thickness distributions of the coatings applied to those surfaces, i.e., in the case of rotationally symmetric coatings, their radial film-thickness characteristic, which, in the following, will also be referred to as their "film-thickness distribution." Flawed film-thickness distributions may have adverse effects, such as a falloff in the transmittances of lenses towards their perimeters, particularly in the case of systems that have sharply curved optical surfaces. In the case of field-lens systems, these effects may be worsened by effects due to optical incidence angles. These incidence angles, which are also termed "incidence angles" or "i-angles," differ at differing radial locations on curved optical surfaces. While axial rays are normally incident on the optical surfaces of lenses at their centers, some of the rays striking their perimeters are incident at very large incidence angles, where incidence angles ranging from 30° to 70° are fairly common in the case of, e.g., projection lenses having high numerical apertures, which may lead to the optical properties of coated lenses being shifted to shorter wavelengths compared to those at their centers. Variations in the refractive indices of coating materials from the centers of coatings out to their perimeters have already been observed, particularly in the case of coatings on sharply curved optical surfaces, which also makes designing coatings difficult.

The aforementioned variation of the refractive index of coatings over their radii is largely due to a decline in the density of the coating material involved from their center out to their perimeter. Here the term "density" refers particularly to the packing density, the optical density and/or the mass density, which are related. The radial decrease in packing density causes other problems, particularly in the case of systems that operate with short-wavelength ultraviolet light. For example, porous coatings absorb more water than smooth coatings having superior packing densities, which may lead to transmission problems at, for example, wavelengths less than about 280 nm, in particular, at wavelengths of 157 nm or less, since UV-light having a wavelength of 157 nm is strongly absorbed by water, and coating-durability problems. Coating-adhesion problems near the perimeters of sharply curved, coated, optical surfaces have been observed.

The suspicion that has been voiced to date is that the observed variations in the refractive indices of coating materials and supple and poorly adhering coating structures near the perimeters of optical surfaces are attributable to the large incidence angles of coating material that occur near the perimeters of optical surfaces. Large incidence angles have also been blamed for scattering losses and for deleterious coating stresses at the perimeters of planar, evaporatively coated, mirrors (cf. U.S. Pat. No. 5,518,518).

Coating systems equipped with planetary-drive systems are frequently employed in order to allow, for example, simultaneously coating several substrates in order to cut coating costs. A planetary-drive system of the type considered here has a primary carrier that may be rotated about a primary rotation axis and is frequently referred to as a "planet carrier" and numerous rotatable substrate carriers, each of which may be rotated with respect to the primary carrier about a respective substrate-carrier rotation axis, and are also termed "planets." When depositing rotationally symmetric coatings, each substrate is clamped onto a substrate carrier such that the symmetry axis of the coating surface coincides with the primary rotation axis. Although the primary rotation axis and the rotation axes of the substrate carriers are usually aligned parallel to one another, they may also be inclined with respect to one another. The substrate carriers are arranged with respect to a material source, which is usually mounted on the primary rotation axis, such that those locations on a surface of a substrate mounted on a substrate carrier that face the material source and are to be coated will be coatable with coating material from the material source that is incident at incidence angles that may vary widely, particularly if the surfaces to be coated are curved. Here the "incidence angles" or "angles of incidence" for each location where a coating is to be deposited are defined as the angles between the local normal to the coating surface at that location and the direction of incidence of coating material at that same location, and usually vary with time.

Masking or baffling methods are employed in order to alleviate some of the aforementioned problems in the case of planetary-drive systems of this particular type. One example of a masking method is described in the article entitled "Optical Coatings for UV Photolithography Systems" that appeared in SPIE Vol. 2775, pp. 335–365. Here masks inserted into the planetary-drive system, between the material source and the substrates, that serve as shielding masks and have a special, computed, shape that allows intermittently masking off solid angles corresponding to high coating-deposition rates such that they yielded a desired, overall, film-thickness characteristic were employed. These correction masks are usually arranged in the vicinities of substrates. For every surface shape and every desired film-thickness characteristic, there is an optimal mask geometry that may be computed.

Since it has been found that conventional masking methods are not always the ideal choice, particularly in cases involving coating sharply curved optical surfaces intended for use in applications involving wavelengths falling within the deep-ultraviolet spectral range and shorter wavelengths, there is need for further improving these sorts of masking methods.

SUMMARY OF THE INVENTION

It is one object of the invention to provide a coating method that will allow depositing coatings which act uniformly over the entire coated surface, particularly on sharply curved substrates intended for use in applications involving the short-wavelength ultraviolet spectral region. It is a further object to provide a coating system suitable for carrying out that method.

As a solution to these and other objects, the invention, according to one formulation, provides a method for coating substrates for optical components with essentially radially symmetric optical coatings, the method including:

arranging at least one substrate with respect to a material source such that coating locations on a coating surface of the substrate facing the material source will be coatable by coating material emanating from the material source;

rotating the substrate about a substrate rotation axis;

controlling a radial film-thickness characteristic of the coating such that quantities of material incident on coating locations on the coating surface are adjusted depending on the radial distances of the coating locations from the substrate rotation axis:

defining a limiting incidence angle that represents a maximum tolerable incidence angle; and controlling the incidence angle by actively limiting the incidence angle such that the incidence angle of coating material at every coating location on that coating surface does not exceed the limiting incidence angle at any time during coating.

Beneficial embodiments are as stated in the dependent claims. The wording of all claims appearing herein is herewith made an integral part of this description by reference.

In the method according to the invention, at least one substrate is arranged with respect to material source arranged within the coating system such that coating locations on a coating surface (i.e. a surface to be coated), that are to be coated facing the material source will be coated with coating material emanating from the material source that is incident thereon at incidence angles that will normally vary with time at a given coating location. The substrates are rotated about a substrate rotation axis. That rotation is essential to the rotational symmetry of the resultant optical coating and provides that the symmetry axis of the rotationally symmetric coating will coincide with the substrate rotation axis. Although a symmetry axis of the optical component involved, if any, will also normally coincide with the substrate's rotation axis, it may also be inclined at an angle thereto or be displaced parallel thereto. Control over a radial film-thickness characteristic of the optical coating involved is exercised such that the quantity of coating material striking the coating surface will vary with radial distance of the location being coated from the substrate's rotation axis. Control over local incidence angles of coating material is also exercised in order that they will not exceed a prescribed limiting incidence angle at any location to be coated on the coating surface. Coating is thus actively confined to a relatively narrow range of incidence angles, where this active confinement provides that the maximum incidence angle that actually occurs will be less than the maximum possible incidence angle, as determined by substrate geometry, system geometry, and the type of system design involved, that would occur without this active confinement.

This confinement of coating to low incidence angles, in particular, to more or less normal incidence or acute incidence angles, of coating material on the surfaces of substrates provides that the resultant coatings will have uniformly high packing densities and low porosities in order that absorption of water and other contaminants will be largely precluded, or, in any event, at least reduced. Variations in the refractive index of the coating material will also be avoided, and the refractive index of the coating material will more nearly equal the refractive index of the bulk material involved than in the case of conventionally deposited coatings, which will greatly simplify coating design. Coating-adhesion problems at the perimeters of coated optical components will also be avoided, which will extend their service lives.

A combination of accurately controlling coating film-thickness distribution and avoiding large coating-material incidence angles is thus proposed. This combination usually requires modifying the measures, i.e., for example, the shapes, sizes, and numbers of shielding masks, for controlling radial film-thickness characteristics employed under conventional baffling methods, since, in determining the quantities of material that need to be evaporated in order to yield a desired radial film-thickness characteristic, due account must be taken of the fact that only materials that is incident at relatively small incidence angles will contribute to coating deposition. For similar types of substrates, coating processes in accordance with the method in accordance with the invention thus usually require using more coating material in the source than conventional methods. However, this minor disadvantage is more than offset by major benefits in terms of the optical and physical properties of the resultant coatings.

The method according to the invention is suitable for depositing nearly rotationally symmetric optical coatings on the surfaces of substrates for optical components, such as lenses or mirrors, that are to be coated, which is preferably carried out in a coating system equipped with a planetary-drive system for moving the substrates during coating. Although the method is specifically intended and suitable for coating substrates whose surfaces to be coated are sharply curved, it may also be employed for coating substrates having nearly planar surfaces or surfaces that are only slightly curved.

Another embodiment of the method provides that, in controlling their radial film-thickness distribution, sections of surfaces to be coated are intermittently shielded from the material source, where a duration of the shielding intervals involved as a function of the radial distance of a location to be coated from the substrate's rotation axis and, preferably, also as a function of the maximum tolerated incidence angle, is set. A first control device having at least one mask that may be arranged between the material source and the substrate and whose shape has been chosen, in particular, though suitable computations, such that shielding intervals of the required duration will result, may be arranged in the coating system for that purpose. Preferred are numerous, permanently mounted, stationary, first masks that may be arranged around the circumference of a common circle encircling the primary rotation axis. Providing a large number of masks, where the individual masks preferably all have the same shape, will be best if the source is located on the primary rotation axis, which will simplify computing the shapes of, and fabricating, the masks and stabilize the initial and terminal conditions of each individual planet. A suitable choice of location for the source, e.g., on the primary rotation axis or slightly offset with respect thereto, will render the coating process insensitive to processing errors, such as off-axis evaporation of the coating material.

A shielding of critical sections of surfaces to be coated from the material source is preferably employed for controlling incidence angles, where "critical sections" are defined as sections thereon where hypothetical incidence angles resulting from the geometry of the surfaces to be coated and their spatial arrangements with respect to the material source exceed the prescribed limiting incidence angle.

In the case of a coating system equipped with a planetary-drive system, some embodiments provide, for each substrate carrier, a second mask that may be arranged between the material source and the substrate, whose shape is such that it yields this shielding against excessively large incidence angles. These second masks may also all have the same shape. In cases where convex surfaces are to be coated, these preferably have an inner edge facing the primary rotation axis that curves radially outward. The overall shape of these masks may resemble a crescent, particularly if the material source is arranged on the primary rotation axis. In cases where concave surfaces are to be coated, their inner edge preferably curves outward, away from the primary rotation axis.

In the case of other embodiments, the second control device, which serves to preclude excessively large incidence angles, a shielding mask having a rim that is eccentrically disposed with respect to the material source over one or more sections of its circumference and encircles the primary rotation axis is arranged between the material source and the substrates. The rim of this mask is thus not quite concentric with the material source. It has been found that minor departures from totally rotationally symmetric coating conditions may be beneficial, in that they allow creating coating systems that are relatively insensitive to minor misalignments of the spatial arrangements of their material source and shielding masks.

The rim or edge of this mask should be tangent to, or nearly tangent to, straight lines passing through the vertices of the substrates and the point where the primary rotation axis intersects the plane of the material source. It will be beneficial if this shielding mask is arranged not too close to the substrates and at a sufficiently large distance from the material source. Mask heights that range from 20% to 50% of the (vertical) distance between the material source and the surfaces to be coated are particularly beneficial.

A slight decentering of this shielding mask may be achieved by, for example, providing that it has a circular rim centered on a (vertical) axis and that that axis is arranged such that it is off-axis with respect to an axis passing through the material source, parallel to the primary rotation axis, by an eccentricity offset. This eccentricity of the material source with respect to the rim of the mask may be achieved in various ways. For example, the mask, or the rim of the mask, may be arranged concentric with the primary rotation axis and positioned such that it is off-axis with respect to the material source, i.e., positioned such that it is laterally displaced from the point where the primary rotation axis intersects the plane of the material source. The mask may also be positioned such that it is off-axis with respect to the primary rotation axis and concentric with the material source. Employing a combination of the two is also possible. Instead of a flat mask that may, for example, be arranged such that it is nearly horizontal, cylindrical masks may also be employed. In the case of such latter arrangements, this slight eccentricity will be beneficial, in that it allows avoiding a singular behavior of the film thickness at the center of the normally spherical, or aspherical, curved surfaces to be coated that, in the case of other types of system, may result from slight misalignments of their masks.

Employing an eccentricity offset that is small compared to the radial distance between the primary rotation axis and the rotation axes of the substrate carriers has been found to be beneficial. Such slightly off-axis positionings of the material source may, for example, occur when this eccentricity offset is less than 30%, in particular, less than 20%, of that radial distance. It will usually be beneficial if this eccentricity offset is more than 1% or 2% of that radial distance.

The shielding mask may also be configured such that it has a slightly elliptical rim or edge. A mask of that type may, for example, be arranged such that it is concentric with respect to the primary rotation axis and employed in conjunction with a material source that is concentric with respect to the primary rotation axis. The elliptical shape of the rims of masks of this sort also yields slight departures from totally rotationally symmetric coating conditions, since their rims are nonrotationally symmetric, and therefore, in that sense, eccentric.

Another means for avoiding excessively large particle incidence angles may be implemented by providing the coating system with a device for rotating the shielding mask about a vertical rotation axis, which will, for example, allow employing an off-axis shielding mask, in particular, a shielding mask having a circular rim, and rotating it about the coating chamber's primary rotation axis, i.e., rotating it relative to the material source. The material source may be arranged such that it is concentric with the coating chamber's primary rotation axis. Rotating this annular mask will allow compensating for the lack of rotational symmetry in coating conditions due to its off-center rotation axis. A rotationally symmetric masking effect due to employment of this mask may be obtained on a time-averaged basis, without running the risk of incurring singularities in the film thicknesses at the centers of the surfaces to be coated.

Alternatively, or in addition, thereto, a device for tilting the rotation axes of substrate carriers may be provided. Combining an, for example, annular, shielding mask with an additional tilting of the substrate carriers (planets) will allow minimizing variations in particle incidence angles over the surfaces to be coated.

Simultaneously coating substrates employing several off-axis sources of material that may be positioned, e.g., around the circumference of a circle encircling the primary rotation axis, and employing a concentric, annular, shielding mask having circular inner and outer rims may also allow achieving approximately rotationally symmetric coating conditions in the vicinities of substrates.

A material source that rotates about the coating system's primary rotation axis, which will allow obtaining similar, beneficial, effects on the uniformity of coating conditions as the aforementioned embodiment, may also be provided.

In the case of those embodiments described here, which have masks with circular rims, the shielding mask may be annular and have a circular, or slightly elliptical, inner rim. Such embodiments are particularly suited to coating substrates having convex surfaces. In cases where concave surfaces are to be coated, the shielding mask should be configured such that its outer rim does the shielding. The shielding mask may be formed from, for example, a nearly circular, or slightly elliptical, piece of sheet metal that may be installed concentric with, or slightly off-axis with respect to, the primary rotation axis.

In order to achieve dense, strongly adhering, coatings, the incidence angles of streams of material emanating from the material source should be as small as possible and undergo the slightest possible variations at given locations on surfaces to be coated. In the case of a preferred embodiment of the method, a limiting incidence angle that is at least 10%, and preferably at least 20%, less than the maximum-possible incidence angle, based on the coating geometry involved, is set. Highly preferred are incidence angles that do not exceed 60° or 45°. The respective optimal mean incidence angles are highly dependent upon the coating materials involved and the operating wavelengths of the coatings involved. The minimum mean incidence angle that may be attained varies with coating-system geometry. It will be particularly beneficial if coating takes place at a mean incidence angle, which should preferably be minimized, that remains virtually constant over all locations to be coated.

In that conjunction, it has been found that it may be beneficial if the limiting incidence angle set is based on the type of coating material involved.

The invention allows creating coatings whose densities fall within the range $\rho_0 \pm 20\%$, in particular, fall within the range $\rho_0 \pm 10\%$, where $\rho_0$ is the mean material density of the coating material involved at the center of the coated surface or at the location where the minimum mean incidence angle occurs. Refractive-index variations and risks that coatings will absorb water or other contaminants may be held within tolerable bounds under these conditions.

One major benefit provided by the invention is that avoiding excessively large evaporation angels allows avoiding the associated coating errors, such as refractive-index variations, while simultaneously allowing accurately controlling the radial film-thickness distributions of coatings over broad ranges. In the case of coatings deposited on curved surfaces, their film thicknesses would monotonically decrease from their centers out to their perimeters by amounts that would vary with their curvatures in the absence of control measures. Conventional means of control, such as employing conventional masking methods, have frequently been utilized for compensating for this decline in film thickness in order to allow arriving at nearly uniform physical film thicknesses over the entire radial extents of coatings. However, that approach may lead to the optical properties of coatings varying widely from their centers out to their perimeters, in spite of their uniform physical film thicknesses, particularly in the case of systems that involve large incidence angles on their optical components. For example, the reflectance minima of anti-reflection coatings will be shifted to shorter wavelengths in such cases. In the case of a preferred embodiment of the method, a radial film-thickness characteristic, whereby the physical film thickness of a coating monotonically increases from the location of its symmetry axis out to its perimeter, is created, which allows providing that the optical effect of the coating will be virtually independent of the distribution of incidence angles involved. Its thickness, which varies with radial location, may, for example, be the result of multiplying its thickness at its center by a correction factor that may, for example, follow an approximately parabolic curve whose vertex is situated at its center. For example, its thickness at its perimeter might exceed that at its center by 5% to 10% or more.

The invention also relates to a coating system suitable for carrying out the method in accordance with the invention that has a planetary-drive system for moving substrates during coating, where its planetary-drive system has a primary carrier (planet carrier) that may be rotated about a primary rotation axis and numerous substrate carriers (planets), each of which may be rotated with respect to the primary carrier about a respective substrate-carrier rotation axis. The coating system comprises a first control device for controlling the radial film-thickness characteristic and a second control device for limiting incidence angles to a maximum tolerable incidence angle. There are embodiments whose first control device has a number of first masks that may be arranged between the material source and the substrates and whose second control device has a number of second masks that corotate with the primary carrier in order to mask off large incidence angles. Embodiments whose second control device is configured such that small departures from totally rotationally symmetric coating conditions may be achieved are also feasible. Examples of such embodiments include systems having centrally mounted, annular or circular, shielding masks, combined with a slightly off-axis material source or systems having either annular or circular shielding masks mounted slightly off-axis combined with a central material source or centrally mounted or slightly elliptical shielding masks combined with a central or slightly off-axis material source, as well as combinations thereof. Embodiments having rotating shielding masks and/or tiltable substrate carriers are also utilizable for the same purposes.

The foregoing and other characteristics of the invention are as stated in both the claims and the description and depicted in the accompanying figures, where the individual characteristics involved may represent characteristics that are patentable alone or several such in the form of combinations of subsets thereof that appear in an embodiment of the invention and may be implemented in other fields, as well as beneficial embodiments that may themselves be patentable.

DETAILED DESCRIPTION OF PREFERRED EMBODIMENTS

Figure 1:
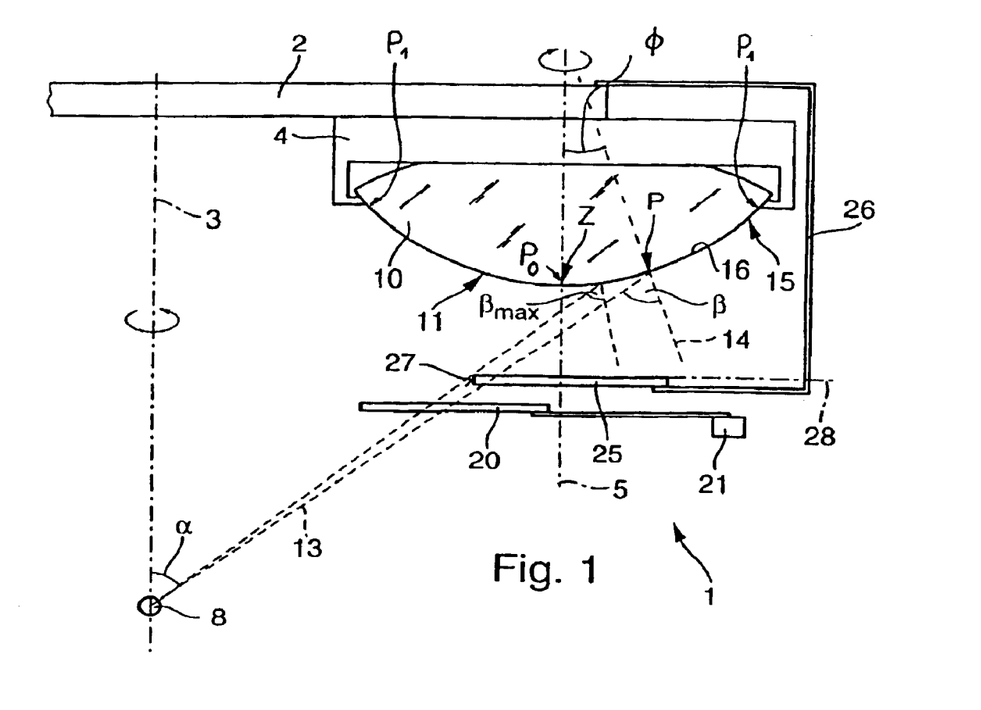
FIG. 1 is a schematized representation of a first embodiment of a planetary-drive system in accordance with the invention employed for discussing coating geometry.

FIG. 1 schematically depicts the geometric arrangement of major components of an evaporation system with which optical components for microlithographic projection systems, in particular, lenses having sharply curved surfaces, may be coated using electron-beam evaporation methods or other PVD-methods, including sputtering, where the extension of the material source is preferably small compared to the coating system's dimensions, i.e. where the material source represents a quasi-point source. Since it may be desirable to simultaneously coat several substrates, which will normally be of similar type, under largely identical processing conditions on costing or technological grounds, the coating system has a planetary-drive system 1 situated within an evacuable coating chamber that is not shown here for moving the substrates to be coated during coating. This planetary-drive system has a nearly circular, disk-shaped, primary carrier 2 that is also termed a "planet carrier" and may be rotated about a vertical primary rotation axis 3 by a drive that is not shown here. This planet carrier has five, or some other number of, identically configured substrate carriers 4 uniformly distributed around its circumference, each of which is mounted such that it may be rotated about a vertical substrate-carrier axis 5. The primary carrier 2 is mounted above a drive shaft gear that is not shown here and is intermeshed with planet gears attached to the planets such that the rotation rate of the planets is a function of the rotation rate of the driven primary carrier and the gear ratio of the drive shaft gear and planet gears. A substrate carrier will thus usually execute several rotations about its axis 5, which rotates about the primary carrier's rotation axis as the substrate carrier rotates, during a single rotation of the primary carrier. A source 8 of material containing the coating material that, in the case of the example shown, is evaporated by an electron beam, is located beneath the planets, at a suitable distance therefrom.

In the case of the deposition of rotationally symmetric coatings to be described here, every planet has a substrate 10 to be coated, which, in the case of the example shown here, is a biconvex lens having a diameter ranging from about 10 cm to 30 cm, fastened to its underside. The surface 11 of the lens that is to be coated is sharply curved. The ratio of its diameter, D, to the radius of curvature, R, of the coating surface may, for example, be less than $-\frac{2}{3}$ or more than $+\frac{2}{3}$, where the optimal ratios for concave and convex surfaces will usually differ. In particular, the optimal ratio, D/R, for concave surfaces might be given by $|D/R|>1.3$, and preferably by $|D/R|>1.6$, while that for convex surfaces might be given by $|D/R|>0.3$, and preferably by $|D/R|>0.67$. The lens 10 is fastened to a substrate carrier 4 such that the center of symmetry Z of the coating to be deposited lies on the symmetry axis of the substrate carrier 5, which, in the case of the example shown here, also coincides with the symmetry axis of the substrate. The point $P_0$ designates the center of the coating surface and the point $P_1$ lies on its perimeter. The parameter ϕ parameterizes the surface 11 and increases with increasing radial distance of a point P from the center of symmetry Z of the coating to be deposited.

If the coating material is heated at the location of the source 8 of material until it evaporates, the material source will emit a beam of evaporated material that will be primarily directed upward and strike the substrates 10 fastened to the planets and other objects situated in its path, thereby yielding specified rates of deposition of the coating material for every location P to be coated on the coating surface that will vary with its positioning relative to the material source. In the case of the sample situation shown in FIG. 1, the coating deposition rate, CDR, i.e., the quantity of coating material deposited per unit time, at the location P will be given by the following equation:

$$CDR(P) = K \cdot \left\{ \frac{[(1-A) \cdot \cos^n \alpha(P) + A] \cdot \cos^m \beta(P)}{r(P)^2} \right\},$$

where K is a constant that depends upon the type of material source involved, A and n specify properties of the material source, α is the angle between the beam 13 of vapor (indicated by the dotted lines) emanating from the source 8 of material and directed at the point P and the symmetry axis of that source of evaporated material, which will, in the ideal case, coincide with the primary rotation axis 3. The parameter β specifies the incidence angle of material coming from the material source at the point P, and is defined as the angle between the local normal 14 to the surface at that point and the direction 13 of the beam of vapor at point P. The parameter m is an exponent specifying the condensation characteristics of the coating material for given processing parameters, such as substrate temperature, and is usually set equal to 1. However, the exponent m may also be less than 1 for some substrate materials and coating materials. For example, m might range from about 0.5 to 1. The parameter r specifies the distance between the source 8 of material and the coating location P.

From FIG. 1, it may be seen that the incidence angle β for every point P lying outside the substrate rotation axis 5 will vary with time as the substrate is rotated. In the case of the curved surface 11 to be coated shown here, which is convex and faces downward, this incidence angle β will be relatively large whenever P lies outside, referred to the source 8 of material, the rotation axis 5 and relatively small whenever the point P lies inside that axis 5, i.e., on the side of that axis that faces toward the source 8 of material, as will occur, e.g., when the substrate shown is rotated through 180°. The opposite will apply if the coating surface is concave, as in the case of, for example, concave mirrors.

It may also be seen that incidence angles at locations on, or near, the rotation axis 5 of the substrate remain virtually constant when the substrate is rotated, while variations in incidence angle increase with increasing radial distance of the coating location from the symmetry axis, where the magnitudes of incidence angles, and the extents to which they vary, are largely dependent upon the curvature of the coating surface and increase with increasing curvature.

"Self-screening" of surfaces to be coated may also occur, particularly if the surfaces to be coated are sharply curved, in which case, sections 15 lying beyond the intersections of straight lines 16 tangent to the surfaces to be coated with those surfaces at a given point in time will not be directly accessible to the beam of evaporated material emanating from the source 8 of material. These tangent lines 16 pass through those points on substrates where the beam of evaporated material emanating from the source 8 of material just grazes their surface (β=90°) for a given set of processing parameters.

Whenever curved surfaces are coated using such a planetary-drive system, it is observed that the physical thickness d of the resultant coating decreases from the its centroid (center of symmetry Z) out to the perimeter of the substrate, where this effect becomes more pronounced for more sharply curved surfaces. How prominent this effect is may differ for concave and convex surfaces. This effect is schematically indicated by the dotted curve 17 in FIG. 3, which presents plots of the ratio of the thickness d of the coating to its thickness $d_0$ at its center of symmetry as a function of radial distance Rad from its center of symmetry. This radial decrease in coating thickness adversely affects the optical properties of such coatings in the sense that their optical properties near their perimeters are frequently worse than at their centers, the location for which the coatings have usually been designed or computed.

In the case of the conventional masking or screening or masking method, influence of these coating flaws is reduced by employing first masks 20 that serve as shielding masks, between the source 8 of material and the substrates, and are usually arranged in the vicinities of the substrates, i.e., immediately below those surfaces to be coated, on, e.g., a stationary, annular, mask holder 21. In the case of the embodiment shown in FIG. 2, six masks of that type that all have the same, identical, shape and are arranged around the circumference of the planetary-drive system are provided. The shape of these masks, which, in the case of the example shown, is a teardrop shape, is computed such that they will intermittently interrupt the stream of material flowing from the source 8 of material to the surfaces of the substrates when the substrates rotate about their axes and about the primary rotation axis 3, where the temporal durations of the resultant interruption intervals are normally chosen such that they are longer for radial segments where deposition rates are extremely high than for radial segments where deposition rates are lower. In particular, employing this approach will allow subjecting segments near the perimeters of substrates to the stream of material for longer periods than segments lying further inward, where the mass flow rate of the stream of material is greater, which will allow controlling the radial film-thickness distribution. The solid curve in FIG. 3 schematically indicates the normalized radial film-thickness characteristic for a curved surface when these stationary first masks 20 are employed, where the shape of these masks has been chosen such that the thickness d of the resultant coating remains essentially constant over the full radial extents of coated surfaces.

Figure 4:
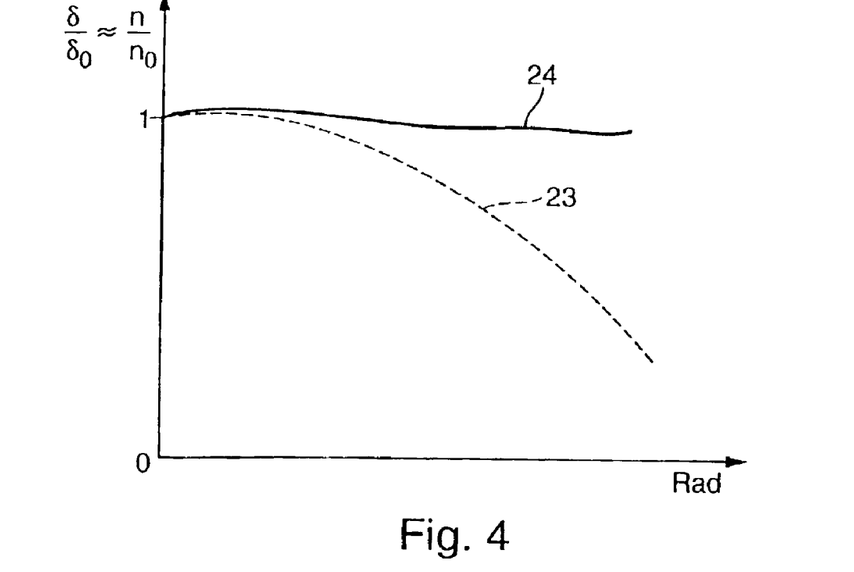
FIG. 4 is a schematic diagram showing various radial variations in the density and refractive index of rotationally symmetric coatings.

Employing these stationary first masks 20 will thus allow affecting the course of the physical thickness d of the coating from its center out to its perimeter. However, coatings of that type, nevertheless, frequently fail to have the desired optical properties and exhibit intolerable differences in their properties between their center and their perimeter. In particular, variations in their densities and the associated variations in their refractive index, i.e., that coatings are more dense and more firmly compacted at their centers and that surface coverage, or their packing density, decreases out to their perimeter, are observed. Adhesion problems may also occur near their perimeter. In order to clarify these problems, FIG. 4 presents plots of the mass density, $\rho$, of a coating, normalized to the mass density, $\rho_0$, at its center of symmetry, as a function of radial distance Rad from its center of symmetry. The dotted curve 23 schematically indicates the decrease in mass density from the center to the perimeter of a coating deposited either without employing shielding masks or a coating deposited employing the stationary masks 20 described above. The refractive index n of such a coating, normalized to its refractive index, $n_0$, at its center, exhibits a similar behavior, since, to a first approximation, refractive index is proportional to mass density. The relationship between refractive index and mass density is given by, e.g., the Lorentz-Lorenz equation, which is well-known to experts in the field.

Figure 2:
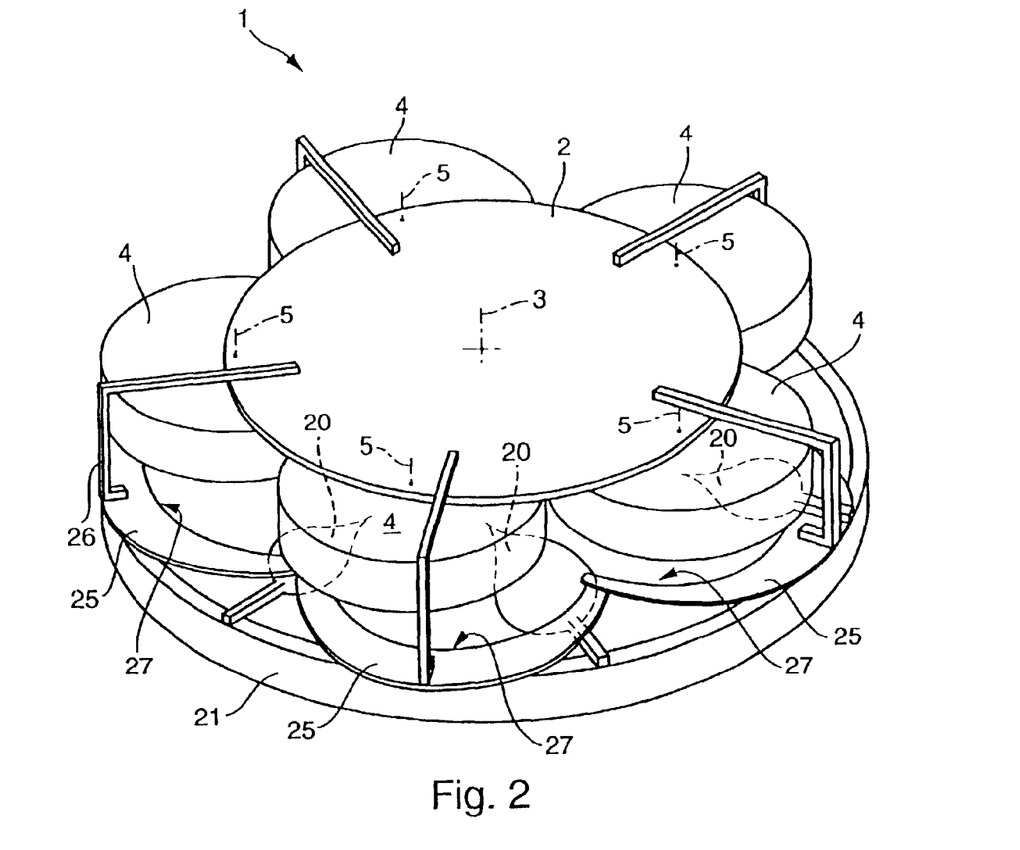
FIG. 2 is an angular-perspective top view of an embodiment of a planetary-drive system in accordance with the invention having first and second masks for affecting coating properties.
Figure 3:
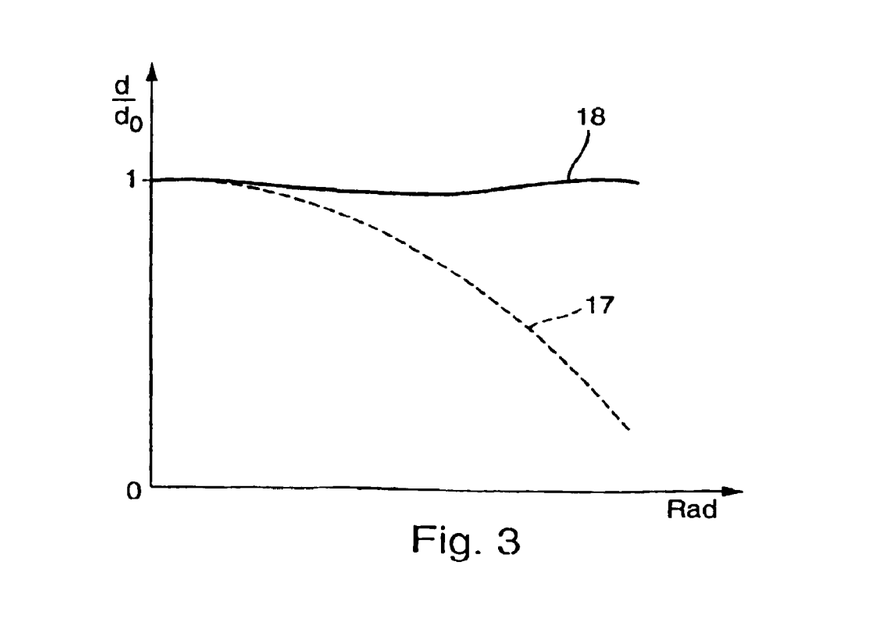
FIG. 3 is a schematic diagram showing various radial variations in the physical thickness of rotationally symmetric coatings.

These problems may be avoided by employing the invention, where, in addition to stationary masks 20, the planetary-drive system shown in FIGS. 1 and 2 has a number of second masks 25, whose number equals the number of planets employed, mounted on the primary carrier 2 and inclined at a suitable angle 26 with respect thereto that corotate about the primary rotation axis 3 with the primary carrier, for that purpose. These second masks are mounted a short distance above the first masks 20, between the source 8 of material and the substrate that is fastened to each planet. These crescent-shaped second masks 25 all have the same, identical, shape and an arced inner edge 27 facing the primary rotation axis 3 that curves away from the primary rotation axis 3.

The shape of the inner edge 27 of each of these masks is defined by the locus of those points on the second mask plane 28 containing the second masks 25 where that plane is intersected by straight lines passing through the source 8 of material and those points P on the surfaces of the substrates that correspond to the maximum incidence angle, or limiting incidence angle $\beta_{max}$, specifically chosen for the particular case involved, at a given point in time. In particular, it may be seen from FIG. 1 that the inner rims 27 of these masks will be shifted closer to the primary rotation axis 3 as the desired limiting incidence angle $\beta_{max}$ is decreased. Since experts in the field are able to accurately compute the shapes of the inner rims of these masks based on geometric considerations, their computation will not be further discussed here.

These crescent-shaped masks represent merely one embodiment among many possible embodiments that also meet the condition regarding limiting maximum incidence angles in order to limit mean incidence angles. In order to limit mean incidence angles, it will be sufficient to bound these masks by an imaginary, averaged, curved line in a manner such that undershootings and overshootings of the shielding of incidence angles due to these masks, or a function thereof, e.g., $\cos^m$ (incidence angle), will average out in the arithmetic sense.

In addition to the aforementioned "simple crescent" shape, masks having this same sort of shape may also be configured such that the contour of their inner edge is defined by a pair of axisymmetric arcs. Other embodiments that meet the aforementioned condition may be computed. The advantage of employing masks that have shapes that differ from this simple crescent shape is that they eliminate "kinks" in coatings' $d/d_0$-curves, where $d_0$ is their thickness at the centroid of the substrate. Correcting for such "kinks" by employing stationary masks necessitates employing masks having jagged edges and thus imposes high positioning accuracies on the arrangement.

Experts in the field will recognize that this shielding of incidence angles that exceed the limiting incidence angle $\beta_{max}$ reduces the total quantity of material deposited per unit time, which may be compensated for by suitably contouring the first masks 20, which may, for example, have narrower lateral widths at radially outlying locations than comparable conventional masks in the absence of any corotating masks 25 of the second type. The resultant shortened shielding intervals will then compensate for the shielding effect of the second, crescent-shaped, masks 25.

An effort should be made to choose the geometry of the second mask 25 such that mean incidence angles will remain virtually constant over those surfaces to be coated. Mean incidence angles should preferably be minimized, which implies that a stream of material that is normally incident on surfaces to be coated is preferred. In the case of preferred methods, the minimum incidence angle on surfaces to be coated that may be achieved occurs at their centroids, and may range from about 20° to about 25°.

The opportunities for avoiding large incidence angles afforded by the invention allow depositing evaporated coatings for which the mass density of the deposited material remains approximately constant from their center of symmetry out to their perimeter and varies by no more than, for example, 10% to 20%, from their center of symmetry to their perimeter. In FIG. 4, the solid curve schematically indicates one possible radial mass-density distribution resulting from limiting incidence angles that, in principle, corresponds to the coating's refractive-index distribution.

Figure 5:
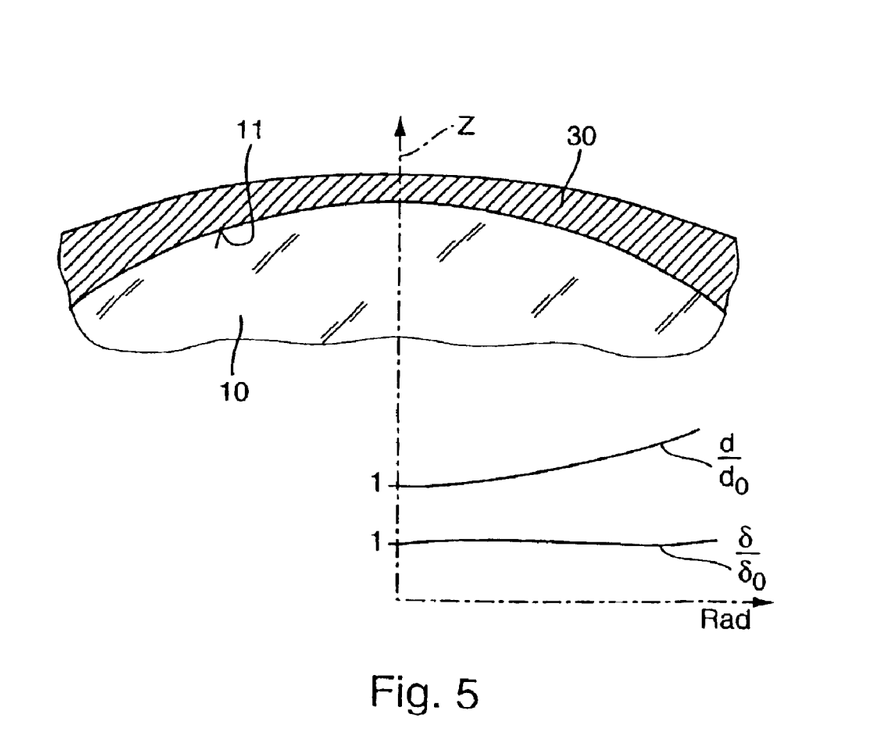
FIG. 5 is a schematized section through a lens having a sharply curved surface onto which a coating deposited in accordance with the invention has been deposited, together with a schematic plot of the radial variations in the physical thickness and mass density of that coating.

Another beneficial embodiment of the invention will now be discussed, based on FIG. 5. FIG. 5 depicts a sectional view of a portion of a lens 10 fabricated from, for example, synthetic quartz glass or a fluoride crystal, whose sharply curved surface 11 has an optical coating 30 that is rotationally symmetric with respect to its axis of symmetry Z., which is also the axis of symmetry of the circular lens 10. In evaporating that coating 30, which might consist of, e.g., one or more dielectric and/or metallic layers, the shape of the first masks 20 was chosen such that, on a time-averaged basis, more material was deposited in the vicinity of the perimeter of the lens than in the vicinity of its axis of symmetry, which yields a coating having a varying radial thickness d that monotonically increases from its center of symmetry out to its perimeter, where its thickness at its perimeter might, for example, be 10% greater than its thickness $d_0$ at its center.

Simultaneously, employment of the corotating second masks 25 provided that material deposited on the lens' surface was incident thereon at small mean incidence angles over its entire radial extent, where maximum incidence angles were limited to, for example, 40°, which yielded a coating 30 having a practically uniform mass-density distribution from its center (mass density d0) out to its perimeter, so that the refractive index of the coating material is also virtually independent of radial location on its coated surface (cf. the plots thereof appearing in FIG. 5).

In the case of the example shown, where the thickness of the coating increases out to its perimeter, the radial variation of its thickness has been chosen such that the shift (phase shift) in coating properties toward shorter wavelengths at the perimeter of the lens due to the larger incidence angles occurring there that is observed for uniformly thick coatings is accurately compensated. The optical properties of the coating, in particular, the location of the reflectance minimum caused by the coating, are thus practically independent of radial location on the lens and the local incidence angles that occur there. In other words, the phase shift for the various rays penetrating the coating 30 remains virtually constant along the radial direction. The thickness gradient required to achieve that constancy depends upon the curvature of the surface 11 to be coated, the refractive index of the coating material, and the incidence angle (i-angle) of the incident radiation. Since, thanks to the invention, the refractive index of the coating material may be made virtually independent of location, coating design and coating deposition are greatly simplified, and better-quality coatings may be deposited.

Figure 6:
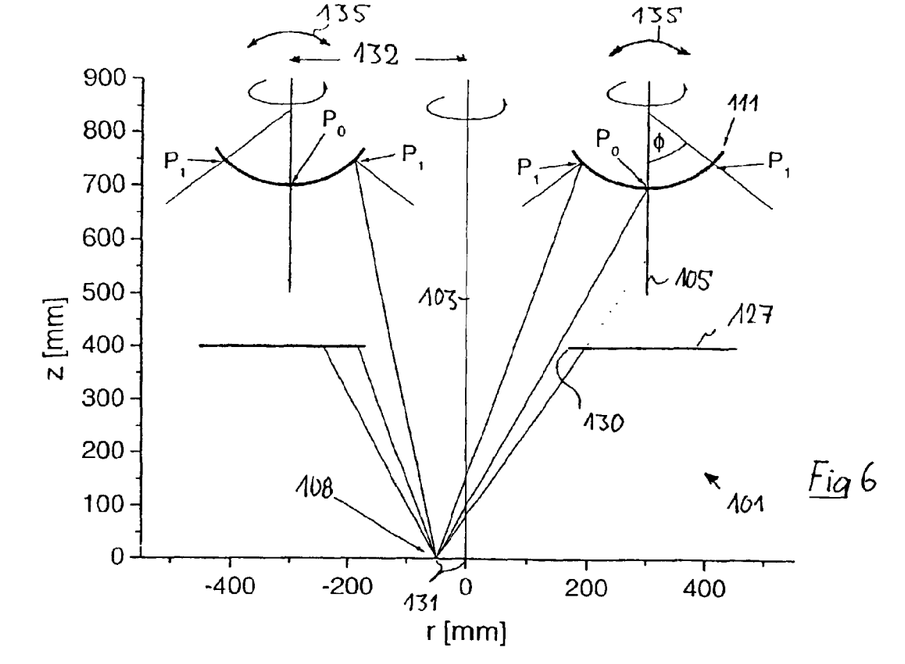
FIG. 6 is a schematized representation of a second embodiment of a planetary-drive system according to the invention having an annular shielding mask and an off-axis material source.

Another embodiment of a planetary-drive system 101 that has a shielding mask 127 for reducing mean incidence angles, will now be presented, based on the schematic representation appearing in FIG. 6. Its dimensions, which are intended to represent an example only, are such that it is suitable for use on systems for coating large-diameter lenses and similar having diameters ranging up to, for example, 30 mm. This system has a set of first shielding masks that are not shown in the figure for controlling the radial film-thickness distributions of deposited coatings. The shape and positionings of these masks may correspond to those of the masks 20 of the first embodiment. The simply designed second control device for actively limiting particle incidence angles has an annular shielding mask 127 that is installed in the coating system such that lies in a horizontal plane. The inner rim 130 of this mask 127 circumscribes a circle about the primary rotation axis 103, which is coincident with the axis of the mask's rim, and is thus centered with respect to the primary rotation axis. This stationary shielding mask 127 is installed roughly halfway between the plane of the source 108 of material and the vertices $P_0$ of the spherical surfaces 111 to be coated such that a straight line passing through the point where the primary rotation axis 103 intersects the plane of the source 108 of material and those vertices just barely grazes the inner rim 130 of the mask 127, which provides that coating of all areas on those spherical surfaces 111 that face away from the primary rotation axis 103, i.e., areas where the largest particle incidence angles would occur, will be masked off at all times.

In the case of this sort of mask geometry, centering the source 108 of material on the primary rotation axis 103 might give rise to the problem that the film thickness at the centers $P_0$ of those surfaces to be coated would be either zero or approximately double that occurring at immediately adjacent areas, depending upon whether the centers of the surfaces to be coated were, or were not, respectively, being momentarily shielded by the masks. Even a slight maladjustment of the height and/or centering of the mask 127 would be sufficient to cause one or the other limiting case to occur and lead to a singularity in the film-thickness distribution occurring near the centers of substrates.

These problems are avoided by introducing a controlled, slight, departure from totally rotationally symmetric coating conditions. In the case of the example shown, that introduction is achieved by arranging the source 108 of material such that it is offset from the primary rotation axis 103 by an eccentricity offset 131. This slightly off-axis location of the material source eliminates risks of the aforementioned singular behavior of the film thickness at the centers of substrates occurring. Providing a moderate separation of, for example, 50 mm, between the material source and the primary rotation axis here will be both sufficient and beneficial. In general, this eccentricity offset 131 should range from around 1%–2% to around 20% or 30% of the radial distance 132 between the primary rotation axis 103 and the rotation axes 105 of the substrate carriers.

The mode of operation of the annular mask 127 for slightly off-axis locations of the evaporator is indicated by the dotted line in FIG. 6. The centers $P_0$ of some of the surfaces to be coated, as well as all other points thereon, will be coated, while the centers of others, as well all other points thereon, will be shielded. Although no singularities in the film-thickness distributions at the centers $P_0$ of substrates will occur during coating, points $P_1$ in the vicinity of the perimeters of the convex surfaces 111 to be coated will be shielded whenever the largest particle incidence angles on their sides that face away from the primary rotation axis would occur.

Figure 7:
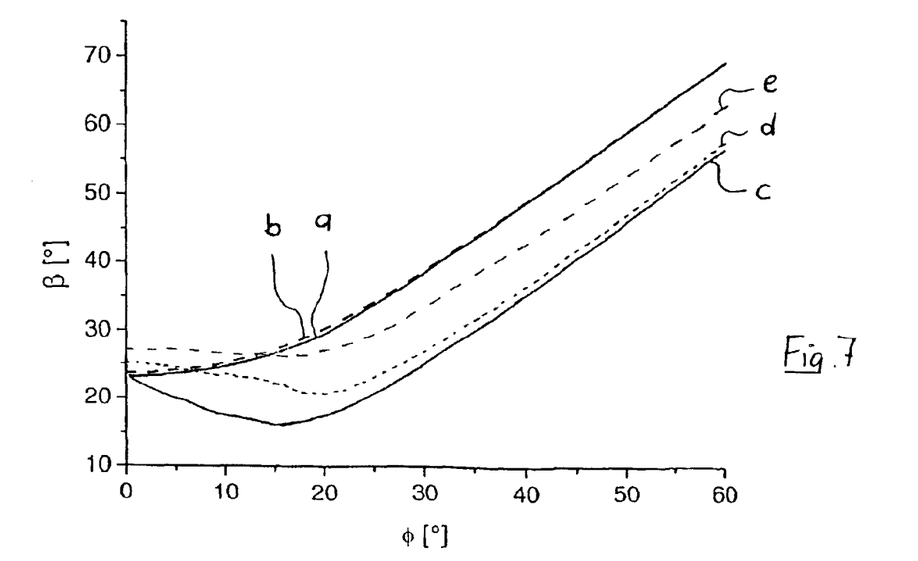
FIG. 7 is a diagram showing computed mean values of particle incidence angles as a function of radial location on a coating surface for a coating deposited without using a shielding mask and a coating deposited using an on-axis, annular, shielding mask for various eccentricity offsets of the material source.

The effectiveness of this annular shielding mask 127 when employed in the geometric arrangement shown will now be demonstrated, based on FIG. 7. FIG. 7 presents plots of the mean particle incidence angles β that occur when coating concave, spherical, surfaces using a planetary-drive system 101 for the case where no masks are employed (curves a and b) and the case where a centered, annular, mask 127 is employed (curves c, d, and e) for various positions of the source 108 of material as a function of radial distance, or angular displacement φ, from the center of the substrate involved. In computing these mean particle incidence angles, the local mean particle incidence angles at various points P on the spherical surface 111 of the substrate while the planetary drive was in motion were computed at time intervals of 0.01 second and then averaged. It may be seen that the position of the material source in the case of coating involving no masks (curve a, which has been computed for the case of a centered evaporator, and curve b, which has been computed for the case of an eccentricity offset of 100 mm) has only an extremely slight effect on mean particle incidence angles, which increase along a roughly parabolic curve with increasing radial distance, or angular displacement φ, from the center of the substrate. A comparison of areas near the perimeters of coatings deposited on spherical surfaces for the case where the material source was shifted off-axis by as much as 50 mm and an annular mask was employed and the case where no annular mask was employed clearly indicates the effectiveness of the annular mask in reducing mean incidence angles. The curves c, d, and e correspond to eccentricity offsets of 1 mm, 50 mm, and 100 mm, respectively. For φ>20°, mean particle incidence angles may be reduced by about 12° by employing the shielding mask 127. If the eccentricity offset is further increased to, for example, 100 mm (curve e), the effectiveness of the annular mask is reduced. The effectiveness of this mask may thus be optimized by choosing a suitable eccentricity offset.

Figure 8:
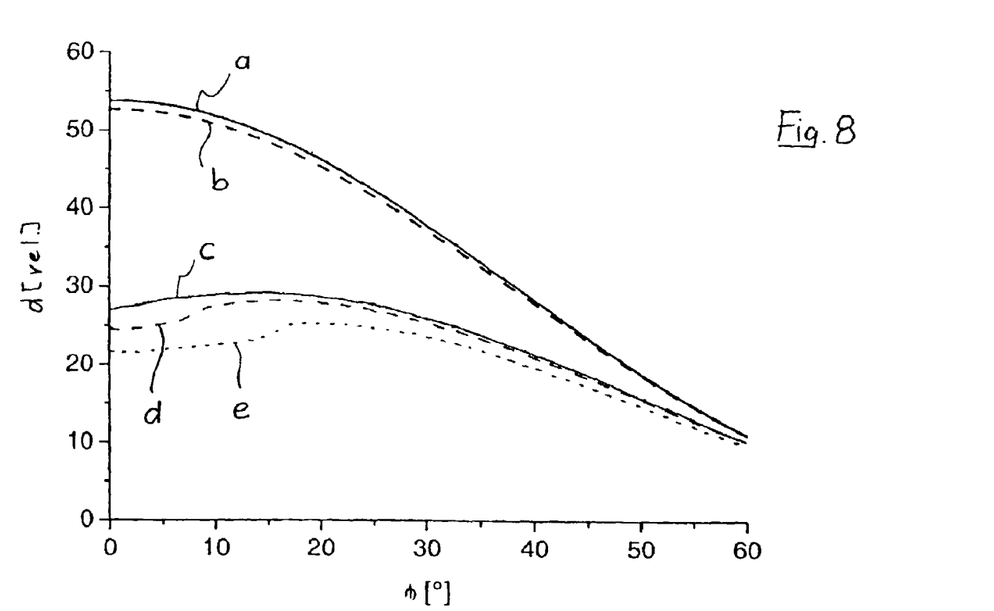
FIG. 8 is a diagram of relative coating thickness as a function of radial distance from its center for the same set of coating conditions stated in conjunction with FIG. 7.

The effect of the shielding mask on coating thickness d, expressed in relative units, for the case of those coating conditions stated above in conjunction with the discussion of FIG. 7 will now be discussed, based on FIG. 8. In the case of coatings that were deposited with no mask employed (curves a and b), their maximum thickness occurs at the center of the spherical surface. To a very close approximation, their thickness decreases along a parabolic curve out to their perimeter. This decrease in their thickness may be corrected by employing the masks 20 discussed earlier, based on FIGS. 1 and 2. As has been explained, that will allow depositing coatings that exhibit, for example, either an essentially uniform thickness distribution or a moderate, parabolic, increase in thickness from their center out to their perimeter (cf. FIG. 5), which demands a rather smooth thickness distribution, which, in turn, demands that the shielding masks employed in order to preclude large incidence angles must be chosen such that they cause no kinks or jump discontinuities in their thickness distribution. As may be seen from FIG. 8, the annular mask 127 causes no prominent kinks in their thickness distributions. Although their thickness distribution is particularly smooth in the case of an approximately centered evaporator position (curve c), the demands on mask positioning accuracy become more stringent. The optimal eccentricity offset 131 may be empirically established. These computations show that the aforementioned values of around 50 mm are beneficial in the case of systems of the indicated size.

The combination of a centered shielding mask having circular rims and an off-axis material source presented here in the form of an example represents merely one possibility for obtaining the described benefits. Yet another means for limiting mean particle incidence angles would be providing a slightly off-axis, annular, mask and centering the material source. The important thing is the slight decentering of the circular rim of the mask with respect to the material source. Combining a centered shielding mask having a slightly elliptical rim with a centered material source is also feasible.

Yet another possibility involves slightly decentering both the material source and the rim of the mask with respect to the primary rotation axis, subject to the condition that the material source and the rim of the mask are slightly decentered with respect to one another over at least one or more sections of the rim of the mask.

Yet another opportunity for reducing the maximum mean incidence angle in cases where a planetary-drive system is employed involves providing a device for tilting the rotation axes of the substrate carriers, as indicated, for example, by the double-headed arrows 135 appearing in FIG. 6. For coating the convex surfaces depicted there, the planets should be tilted outward; for coating concave surfaces (cf. FIG. 10), they should be tilted inward. This tilting causes the maximum mean particle incidence angle to occur at the center and perimeter of spherical, or aspherical, curved surfaces. However, if this tilting of the planets is optimized such that these two maxima, i.e., that which occurs at the center and that which occurs at the perimeter of such curved surfaces, are approximately equal, then the range of mean incidence angles that occurs over such curved surfaces may be minimized, which will also minimize variations in the optical constants of coatings deposited on such curved surfaces over those surfaces.

Figure 9:
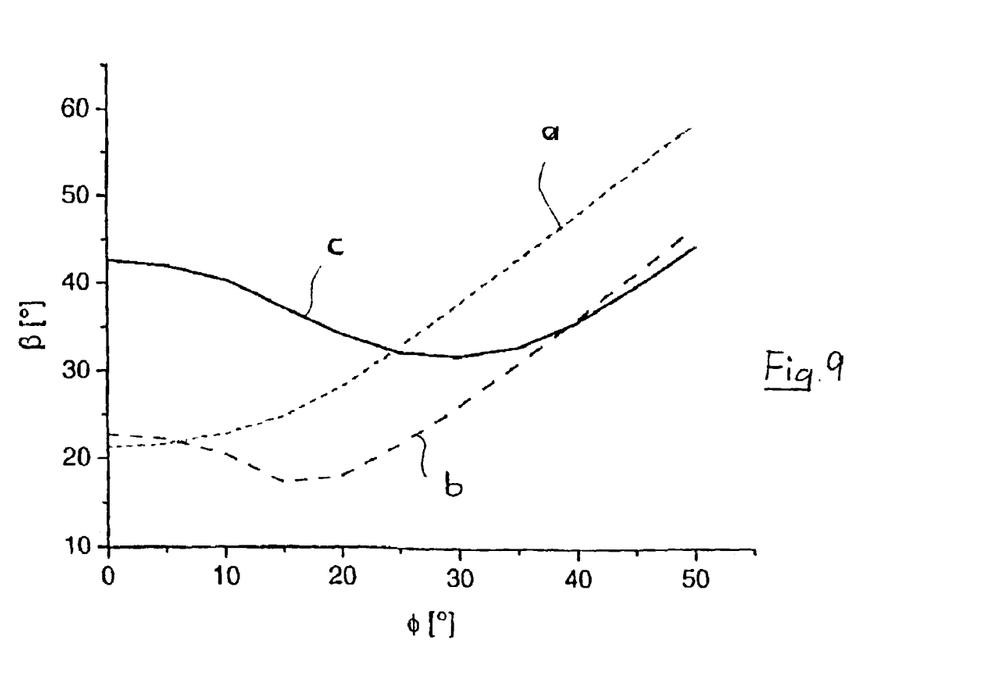
FIG. 9 is a diagram showing the effects of tilting the axes of planets on variations in local mean particle incidence angles over the radial extent of a coating surface.

FIG. 9 presents plots of the mean incidence angles β of particles on a convex, spherical, surface having a radius, r, of r=150 mm for the case of coating using a planetary-drive system of the type presented here for various configurations. Compared are coating it without using a mask and without tilting the substrate carriers (curve a) and coating it using an annular shielding mask, both with no tilting of the substrate carriers (curve b) and for the case where the substrate carriers are tilted outward through an angle of around 20° (curve c). Although it is clear that variations in mean particle incidence angles may be greatly reduced by tilting the planet axes (substrate-carrier axes), local mean particle incidence angles increase over large areas of the spherical surface involved.

Figure 10:
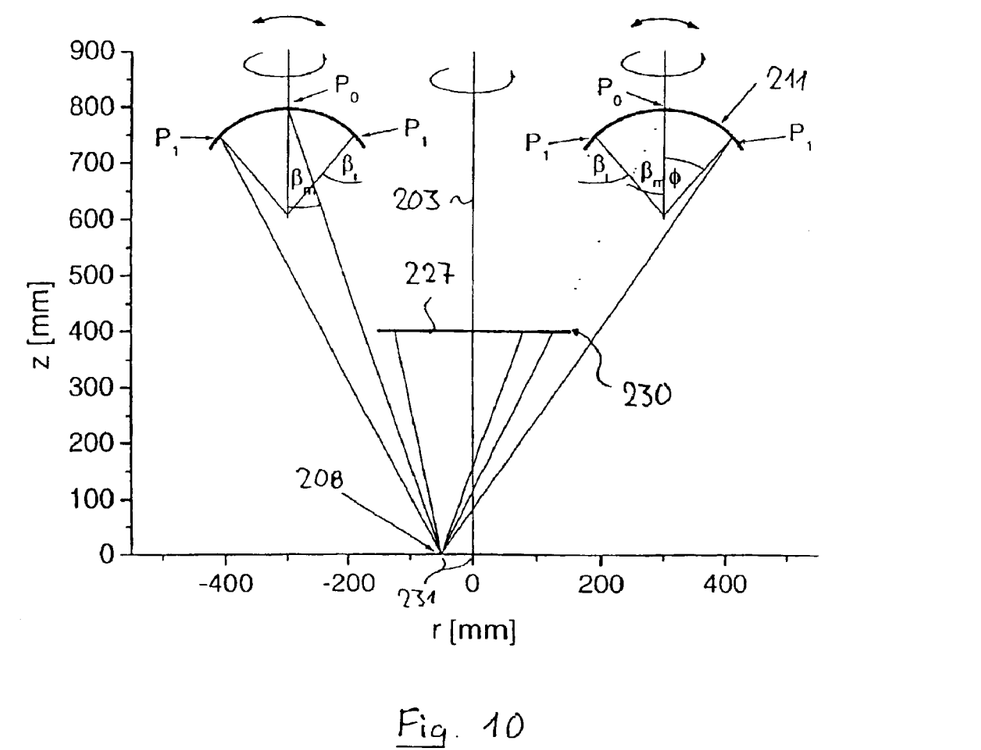
FIG. 10 is a schematized representation of an embodiment of a planetary-drive system for use in coating concave surfaces.

From FIG. 10, it may be seen that the invention may also be used for coating concave, spherical or aspherical, surfaces 211. In the case of such surfaces, those areas where the largest particle incidence angles β occur lie near their perimeter and on the side facing the primary rotation axis 203. The embodiment schematically represented in FIG. 9 employs a shielding mask 227 that is essentially configured in the form of a circular disk or circular plate having a central, circular, rim 230 centered on the primary rotation axis 203 for reducing mean particle incidence angles. Both the height of this shielding mask 227 between the off-axis (by an eccentricity offset 231) material source and the substrates and the position of the diameter of the disk defining the rim of the mask should be chosen in much the same manner as in the case of the geometry shown in FIG. 6.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

What is claimed:

1. A method for coating substrates for optical components with essentially radially symmetric optical coatings, the method comprising:

providing no more than one material source the one material source located at a material source position;

arranging at least one substrate with respect to the material source such that coating locations on a coating surface of the substrate facing the material source are coated by coating material emanating from the material source;

rotating the substrate about a substrate rotation axis;

controlling a radial film-thickness characteristic of the coating such that quantities of material incident on coating locations on the coating surface are adjusted depending on the radial distances of the coating locations from the substrate rotation axis;

defining a limiting incidence angle that represents a maximum tolerable incidence angle; and controlling an incidence angle of the coating material by limiting the incidence angle such that the incidence angle at every coating location on the coating surface does not exceed the limiting incidence angle at any time during coating.

2. A method according to claim 1, wherein said controlling of the incidence angle comprises:

intermittently shielding parts of the coating surface from the material source when controlling the radial film-thickness characteristic, where a duration of temporal shielding intervals is set as a function of the radial distances of the coating locations from the substrate rotation axis and as a function of the limiting incidence angle.

3. A method according to claim 1, wherein said controlling of the incidence angle comprises:

shielding critical sections of the coating surface from the material source when controlling the incidence angle, where the hypothetical maximum-possible incidence angle for such critical sections exceeds the limiting incidence angle.

4. A method according to claim 1, wherein the limiting incidence angle is set to be at least 10% less than a maximum-possible incidence angle.

5. A method according to claim 1, wherein the limiting incidence angle is set to be 60° or less.

6. A method according to claim 1, wherein the limiting incidence angle is set to yield a mean incidence angle at every coating location, wherein the mean incidence angle at any coating location differs from the mean incidence angle of any other such location by less than 20%.

7. A method according to claim 1, wherein the limiting incidence angle set is such that the maximum incidence angle at any coating location differs from a mean incidence angle at that location by less than 10%.

8. A method according to claim 1, wherein the limiting incidence angle is set depending upon the coating materials involved.

9. A method according to claim 1, further comprising:

depositing a coating for which the density of the coating material deposited differs from a mean density, $\rho_0$, of that coating material at a coating symmetry axis by less than 20% over the coating radius.

10. A method according to claim 1, further comprising:

creating a radial film-thickness characteristic for which a physical thickness of the coating monotonically increases with distance from a symmetry axis of the coating out to a perimeter of the coating during coating, where the physical thickness of the coating at the coating perimeter exceeds the physical thickness of the coating in a vicinity of the symmetry axis by at least 5%.

11. A method according to claim 1, further comprising:

creating an essentially parabolic physical-film-thickness gradient extending from a coating symmetry axis to a coating perimeter.

12. A method according to claim 1, wherein the coating is performed by evaporating coating material present in the material source.

13. A method according to claim 1, further comprising:

coating substrates whose coating surfaces are sharply curved, where an absolute value of the ratio of the diameter of the coating surface to the radius of curvature of the coating surface exceeds approximately $\frac{2}{3}$.

14. A coating system for coating substrates for optical components with essentially radially symmetric optical coatings, the coating system comprising:

no more than one material source the one material source located at a material source position;

means for arranging at least one substrate with respect to the material source such that coating locations on a coating surface of the substrate facing the material source are coated by coating material emanating from the material source;

means for rotating the substrate about a substrate rotation axis;

means for controlling a radial film-thickness characteristic of the coating such that quantities of material incident on coating locations on the coating surface are adjusted depending on the radial distances of the coating locations from the substrate rotation axis;

means for defining a limiting incidence angle that represents a maximum tolerable incidence angle; and means for controlling an incidence angle of the coating material by limiting the incidence angle such that the incidence angle at every coating location on the coating surface does not exceed the limiting incidence angle at any time during coating.

15. The coating system according to claim 14, wherein the means for arranging comprise a substrate carrier.

16. The coating system according to claim 15, further comprising means for tilting the substrate carrier with respect to a primary rotation axis.

17. The coating system according to claim 14, wherein the means for rotating comprise a planetary-drive system.

18. The coating system according to claim 14, wherein said means for controlling the incidence angle comprises:

means for intermittently shielding parts of the coating surface from the material source when controlling the radial film-thickness characteristic, where a duration of temporal shielding intervals is set as a function of the radial distances of the coating locations from the substrate rotation axis and as a function of the limiting incidence angle.

19. The coating system according to claim 18, wherein the means for intermittently shielding comprise a mask.

20. The coating system according to claim 19, wherein the means for controlling the incidence angle comprise a second mask.

21. The coating system according to claim 20, further comprising means for rotating the second mask about a further rotation axis.

22. The coating system according to claim 14, further comprising means for rotating the material source about a further rotation axis.

23. The coating system according to claim 14, wherein said means for controlling the incidence angle comprises:

means for shielding critical sections of the coating surface from the material source when controlling the incidence angle, where the hypothetical maximum-possible incidence angle for such critical sections exceeds the limiting incidence angle.

24. The coating system according to claim 14, further comprising:
means for depositing a coating for which the density of the coating material deposited differs from a mean density, $\rho_0$, of that coating material at a coating symmetry axis by less than 20% over the coating radius.

25. The coating system according to claim 14, further comprising:
means creating a radial film-thickness characteristic for which a physical thickness of the coating monotonically increases with distance from a symmetry axis of the coating out to a perimeter of the coating during coating, where the physical thickness of the coating at the coating perimeter exceeds the physical thickness of the coating in a vicinity of the symmetry axis by at least 5%.

26. The coating system according to claim 14, further comprising:
means for creating an essentially parabolic physical-film-thickness gradient extending from a coating symmetry axis to a coating perimeter.

27. The coating system according to claim 14, further comprising:
means for coating substrates whose coating surfaces are sharply curved, where an absolute value of the ratio of the diameter of the coating surface to the radius of curvature of the coating surface exceeds approximately $\frac{2}{3}$.

28. A coating system for coating substrates for optical components, the coating system comprising:
no more than one material source outputting a coating material;
at least one substrate arranged with respect to the material source such that coating locations on a coating surface of the substrate facing the material source are coated by the coating material;
a drive system configured to rotate the substrate about a substrate rotation axis;
a first control device configured to control a radial film-thickness characteristic of the coating such that quantities of material incident on the coating locations on the coating surface are adjusted depending on the radial distances of the coating locations from the substrate rotation axis; and
a second control device configured to control an incidence angle of the coating material such that the incidence angle of the coating material at every coating location on the coating surface does not exceed a prescribed limiting incidence angle at any time during coating.

29. A method for coating substrates for optical components with essentially radially symmetric optical coatings, the method comprising:
arranging at least one substrate with respect to a material source such that coating locations on a coating surface of the substrate facing the material source are coated by coating material emanating from the material source;
rotating the substrate about a substrate rotation axis;
controlling a radial film-thickness characteristic of the coating such that quantities of material incident on coating locations on the coating surface are adjusted depending on the radial distances of the coating locations from the substrate rotation axis;

defining a limiting incidence angle that represents a maximum tolerable incidence angle;
controlling an incidence angle of the coating material by limiting the incidence angle such that the incidence angle at every coating location on the coating surface does not exceed the limiting incidence angle at any time during coating; and
intermittently shielding parts of the coating surface from the material source when controlling the radial film-thickness characteristic, where a duration of temporal shielding intervals is set as a function of the radial distances of the coating locations from the substrate rotation axis and as a function of the limiting incidence angle.

30. A method for coating substrates for optical components with essentially radially symmetric optical coatings, the method comprising:
arranging at least one substrate with respect to a material source such that coating locations on a coating surface of the substrate facing the material source are coated by coating material emanating from the material source;
rotating the substrate about a substrate rotation axis;
controlling a radial film-thickness characteristic of the coating such that quantities of material incident on coating locations on the coating surface are adjusted depending on the radial distances of the coating locations from the substrate rotation axis;
defining a limiting incidence angle that represents a maximum tolerable incidence angle; and
controlling an incidence angle of the coating material by limiting the incidence angle such that the incidence angle at every coating location on the coating surface does not exceed the limiting incidence angle at any time during coating;
wherein the limiting incidence angle is set depending upon the coating materials involved.

31. A method for coating substrates for optical components with essentially radially symmetric optical coatings, the method comprising:
arranging at least one substrate with respect to a material source such that coating locations on a coating surface of the substrate facing the material source are coated by coating material emanating from the material source;
rotating the substrate about a substrate rotation axis;
controlling a radial film-thickness characteristic of the coating such that quantities of material incident on coating locations on the coating surface are adjusted depending on the radial distances of the coating locations from the substrate rotation axis;
defining a limiting incidence angle that represents a maximum tolerable incidence angle;
controlling an incidence angle of the coating material by limiting the incidence angle such that the incidence angle at every coating location on the coating surface does not exceed the limiting incidence angle at any time during coating; and
depositing a coating for which the density of the coating material deposited differs from a mean density, $\rho_0$, of that coating material at a coating symmetry axis by less than 20% over the coating radius.

32. A method for coating substrates for optical components with essentially radially symmetric optical coatings, the method comprising:
arranging at least one substrate with respect to a material source such that coating locations on a coating surface of the substrate facing the material source are coated by coating material emanating from the material source;

rotating the substrate about a substrate rotation axis;

controlling a radial film-thickness characteristic of the coating such that quantities of material incident on coating locations on the coating surface are adjusted depending on the radial distances of the coating locations from the substrate rotation axis;

defining a limiting incidence angle that represents a maximum tolerable incidence angle;

controlling an incidence angle of the coating material by limiting the incidence angle such that the incidence angle at every coating location on the coating surface does not exceed the limiting incidence angle at any time during coating; and creating a radial film-thickness characteristic for which a physical thickness of the coating monotonically increases with distance from a symmetry axis of the coating out to a perimeter of the coating during coating, where the physical thickness of the coating at the coating perimeter exceeds the physical thickness of the coating in a vicinity of the symmetry axis by at least 5%.

33. A method for coating substrates for optical components with essentially radially symmetric optical coatings, the method comprising:

arranging at least one substrate with respect to a material source such that coating locations on a coating surface of the substrate facing the material source are coated by coating material emanating from the material source;

rotating the substrate about a substrate rotation axis;

controlling a radial film-thickness characteristic of the coating such that quantities of material incident on coating locations on the coating surface are adjusted depending on the radial distances of the coating locations from the substrate rotation axis;

defining a limiting incidence angle that represents a maximum tolerable incidence angle;

controlling an incidence angle of the coating material by limiting the incidence angle such that the incidence angle at every coating location on the coating surface does not exceed the limiting incidence angle at any time during coating; and creating an essentially parabolic physical-film thickness gradient extending from a coating symmetry axis to a coating perimeter.

34. A coating system for coating substrates for optical components with essentially radially symmetric optical coatings, the coating system comprising:

means for arranging at least one substrate with respect to a material source such that coating locations on a coating surface of the substrate facing the material source are coated by coating material emanating from the material source, wherein the means for arranging comprises a substrate carrier;

means for rotating the substrate about a substrate rotation axis;

means for controlling a radial film-thickness characteristic of the coating such that quantities of material incident on coating locations on the coating surface are adjusted depending on the radial distances of the coating locations from the substrate rotation axis;

means for defining a limiting incidence angle that represents a maximum tolerable incidence angle;

means for controlling an incidence angle of the coating material by limiting the incidence angle such that the incidence angle at every coating location on the coating surface does not exceed the limiting incidence angle at any time during coating; and means for tilting the substrate carrier with respect to a primary rotation axis.

35. A coating system for coating substrates for optical components with essentially radially symmetric optical coatings, the coating system comprising:

means for arranging at least one substrate with respect to a material source such that coating locations on a coating surface of the substrate facing the material source are coated by coating material emanating from the material source;

means for rotating the substrate about a substrate rotation axis;

means for controlling a radial film-thickness characteristic of the coating such that quantities of material incident on coating locations on the coating surface are adjusted depending on the radial distances of the coating locations from the substrate rotation axis;

means for defining a limiting incidence angle that represents a maximum tolerable incidence angle;

means for controlling an incidence angle of the coating material by limiting the incidence angle such that the incidence angle at every coating location on the coating surface does not exceed the limiting incidence angle at any time during coating; and means for intermittently shielding parts of the coating surface from the material source when controlling the radial film-thickness characteristic, where a duration of temporal shielding intervals is set as a function of the radial distances of the coating locations from the substrate rotation axis and as a function of the limiting incidence angle.

36. A coating system for coating substrates for optical components with essentially radially symmetric optical coatings, the coating system comprising:

means for arranging at least one substrate with respect to a material source such that coating locations on a coating surface of the substrate facing the material source are coated by coating material emanating from the material source;

means for rotating the substrate about a substrate rotation axis;

means for controlling a radial film-thickness characteristic of the coating such that quantities of material incident on coating locations on the coating surface are adjusted depending on the radial distances of the coating locations from the substrate rotation axis;

means for defining a limiting incidence angle that represents a maximum tolerable incidence angle;

means for controlling an incidence angle of the coating material by limiting the incidence angle such that the incidence angle at every coating location on the coating surface does not exceed the limiting incidence angle at any time during coating; and means for depositing a coating for which the density of the coating material deposited differs from a mean density, $\rho_0$, of that coating material at a coating symmetry axis by less than 20% over the coating radius.

37. A coating system for coating substrates for optical components with essentially radially symmetric optical coatings, the coating system comprising:

means for arranging at least one substrate with respect to a material source such that coating locations on a coating surface of the substrate facing the material source are coated by coating material emanating from the material source;

means for rotating the substrate about a substrate rotation axis;

means for controlling a radial film-thickness characteristic of the coating such that quantities of material incident on coating locations on the coating surface are adjusted depending on the radial distances of the coating locations from the substrate rotation axis;

means for defining a limiting incidence angle that represents a maximum tolerable incidence angle;

means for controlling an incidence angle of the coating material by limiting the incidence angle such that the incidence angle at every coating location on the coating surface does not exceed the limiting incidence angle at any time during coating; and means for creating a radial film-thickness characteristic for which a physical thickness of the coating monotonically increases with distance from a symmetry axis of the coating out to a perimeter of the coating during coating, where the physical thickness of the coating at the coating perimeter exceeds the physical thickness of the coating in a vicinity of the symmetry axis by at least 5%.

38. A coating system for coating substrates for optical components with essentially radially symmetric optical coatings, the coating system comprising:

means for arranging at least one substrate with respect to a material source such that coating locations on a coating surface of the substrate facing the material source are coated by coating material emanating from the material source;

means for rotating the substrate about a substrate rotation axis;

means for controlling a radial film-thickness characteristic of the coating such that quantities of material incident on coating locations on the coating surface are adjusted depending on the radial distances of the coating locations from the substrate rotation axis;

means for defining a limiting incidence angle that represents a maximum tolerable incidence angle;

means for controlling an incidence angle of the coating material by limiting the incidence angle such that the incidence angle at every coating location on the coating surface does not exceed the limiting incidence angle at any time during coating; and means for creating an essentially parabolic physical-film-thickness gradient extending from a coating symmetry axis to a coating perimeter.

39. A method according to claim 1, further comprising:

vaporizing the material present in the material source such that vaporized particles are created; and projecting the vaporized particles onto the coating surface.

40. The coating system according to claim 14, further comprising:

means for vaporizing the material present in the material source such that vaporized particles are created; and means for projecting the vaporized particles onto the coating surface.

* * * * *